(12) United States Patent
Blaum et al.

(10) Patent No.: US 6,748,568 B2
(45) Date of Patent: Jun. 8, 2004

(54) APPARATUS AND METHOD FOR VERIFYING PROPER DATA ENTRY AND DETECTING COMMON TYPING ERRORS

(75) Inventors: Mario Blaum, San Jose, CA (US); William J. Kabelac, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 552 days.

(21) Appl. No.: 09/791,593

(22) Filed: Feb. 26, 2001

(65) Prior Publication Data
US 2002/0120905 A1 Aug. 29, 2002

(51) Int. Cl.⁷ .................. G06F 11/00
(52) U.S. Cl. .......... 714/800; 178/17 C; 178/18.01; 178/23 A; 235/59; 358/463; 375/254
(58) Field of Search .......... 714/763, 752, 714/762, 799, 800; 395/32; 369/48–54; 178/3, 4, 17, 17 C, 18.01, 21, 23 A; 235/59–60, 492; 358/463; 375/254

(56) References Cited

U.S. PATENT DOCUMENTS

| | | | |
|---|---|---|---|
| 3,624,637 A | | 11/1971 | Irwin |
| 4,035,766 A | | 7/1977 | Barker |
| 4,604,748 A | * | 8/1986 | Sato |
| 5,572,423 A | * | 11/1996 | Church .................. 715/533 |
| 5,576,955 A | | 11/1996 | Newbold et al. |
| 5,784,635 A | | 7/1998 | McCallum |
| 6,101,245 A | * | 8/2000 | Gilai .................. 379/100.14 |

FOREIGN PATENT DOCUMENTS

| | | |
|---|---|---|
| JP | 54-35626 | 3/1979 |
| JP | 11-175237 | 7/1999 |

OTHER PUBLICATIONS

W. E. Brandt, "Error Detecting and Correcting Circuit", 1960, vol. 3 No. 6, pp. 23–26.
M. Blaum, "Systematic Codes for Detecting Unidirectional Burst of Errors", 1988, vol. 30, No. 9, pp. 361–362.

* cited by examiner

Primary Examiner—Guy J. Lamarre
(74) Attorney, Agent, or Firm—McGinn & Gibb, PLLC; Marc D. McSwain, Esq.

(57) ABSTRACT

A method and apparatus for detecting typing errors of critical fixed series of characters (digits) by using at least one redundant parity digit. The invention detects the most common typing errors that involve both permutations and incorrect striking of adjacent characters during data entry via a keyboard of an electronic apparatus. The method provides warning to the data input operator when incorrect data entry occurs and optionally automatically suspends entry thereof.

41 Claims, 2 Drawing Sheets

APPARATUS AND METHOD FOR VERIFYING PROPER DATA ENTRY AND DETECTING COMMON TYPING ERRORS

BACKGROUND OF THE INVENTION

1. Field of the Invention

The present invention generally relates to verifying correct data entry to an electronic apparatus, and particularly, to alerting an operator of incorrect data entry.

2. Description of the Related Art

Widespread use of electronic data processing devices such as personal computers, personal digital assistant devices and similar apparatus, with data entry devices such as keyboards, inevitably involves more and more confidential personal data being entered, and subsequently being transmitted with unknown consequences. In particular, such data is typically entered by an operator where incorrect entry frequently occurs. Mis-entered data can have tragic consequences since misidentified personal confidential data (e.g., credit reports, prior criminal records, etc.) are subsequently associated with that person. For example, a mis-entered U.S. social security number of a person during some transaction can harm that person's reputation, prospective job opportunities or business concerns since it is a key identifier of a person in the U.S. today.

Related prior art that deals with mis-entered data, e.g. FAX telephone numbers, include U.S. Pat. No. 6,101,245 that discloses a dial verifier for facsimile (FAX) transmissions, which attempts to minimize mis-dialed FAX numbers from occurring, by dialing pre-compiled control keys that are added to telephone numbers, which is hereby incorporated by reference. The control keys are compared against computed control keys and transmission is allowed or denied according to a match between the dialed and computed control keys. However, this method has limiting aspects since the number of control keys has to be a prime number, which in the case of telephone digits requires the introduction of foraneous symbols (i.e., symbols such as "#", "$" or "*" etc.) for the number "10." To use this method for a fixed series of characters, foraneous symbols must be added to reach the required next prime number (e.g., for the 16 hexadecimal numbers a foraneous symbol must be added to achieve the next prime number 17). Problems associated with this method include inherent complexity and limited utility since modification of existing data bases must be implemented when using these foraneous symbols as control keys to encode a series of characters, e.g., a FAX number. Use in other applications, such as large databases that relate critical numbers such as a social security number or a credit card number cannot readily be adapted to this patented method since it requires deviation from traditional methods of assigning only pure numbers for these special number designators. With the improved methods of the present invention using an encoding algorithm based on integer rings, or on prime power fields of numbers as presented below, either there is no need to use foraneous symbols, or the number of foraneous symbols may be greatly reduced.

In particular, the U.S. Pat. No. 6,101,245 applies a method to phone number integers using modulo 11 arithmetic to determine the control key codes. Since 11 is a prime number, the vector of weights as used therein has only to satisfy the condition that all the digits are different until they are repeated. In particular, adjacent digits have to be different so as to detect permutations of adjacent digits. Also, since the integers modulo 11 constitute a field, there are no zero divisors and any typing error in one digit is detected. Thus, the detection capability of the patented method can detect many permutation errors and any mistyped digit, but has the disadvantage of requiring a foraneous symbol. Telephone companies, credit card companies or governmental agencies may be reluctant to introduce foraneous symbols in the management of large databases that traditionally involve only numbers.

The advantages of using the prime power number encoding algorithm of one of the preferred embodiments of the present invention compared to the U.S. Pat. No. 6,101,245 can be illustrated by reviewing the example given at column 11, lines 39–53 of the '245 patent that is applied to numeric as well as case-sensitive letters totaling 62 in number of symbols. The next prime number larger than 62 is 67. This requires the addition of 5 foraneous symbols that are used by this method. On the other hand, by using one of the preferred embodiments to be described next, the next power of a prime is 64, which requires only two foraneous symbols, thereby requiring fewer such symbols for an improved an more efficient encoding method.

Mis-entered data often involves errors in numerical data typed on a data entry keyboard. Those erroneously entered numbers may be credit card or social security numbers that are often linked to critical data. The most common typing errors when entering such numbers include transposition of two adjacent numbers (for example, 25 is typed as 52); and a number is typed in error as one of two possible adjacent numbers (e.g., 4 or 2 are typed instead of 3). If such common errors are not instantly detected, a lot of time may be wasted trying to correct them later and sometimes the error may have tragic consequences. For instance, when entering a social security number, if the operator makes a typing error and assigns a number corresponding to another user when handling a request, correcting the situation at a later time is both a waste of time and resources and may not be possible due to consequences beyond one's control after critical information has been transmitted.

Therefore, there is a need in data entry arts typically associated with keyboard data entry so that most common typing errors are immediately detected for appropriate correction during data entry.

SUMMARY OF THE INVENTION

It is, therefore, an object of the present invention to provide a method and systems for use of this method giving mechanisms for detecting at least the two common typing errors described above by adding one or more redundant parity characters (digits).

The method of the invention uses at least one redundant parity digit, and performs arithmetic modulo an integer in order to obtain said redundant parity digits without adding foraneous symbols. In a second embodiment of the invention the number of foraneous symbols is minimized by using an encoding algorithm based on finite field arithmetic over a field whose number of elements is a prime power. Both embodiments verify the correctness of the redundant symbols and in case of a mismatch a mechanism is used for warning of errors. Another embodiment has more powerful error detection capabilities, but can use foraneous symbols that are limited in number.

Specifically, the preferred method of using the invention is for detection of a permutation of adjacent characters (digits) or mis-typing of adjacent characters (digits) on the keyboard. The method can be extended to other typographical characters as well and limited only to numbers. With the pervasiveness of e-commerce, where important short vectors of crucial information need to be constantly typed, the method has numerous applications. The invention enhances error detection by adding an arbitrary number of parity characters (digits), wherein most errors can be detected. Moreover, the invention can be applied to situations where numbers are entered using a keypad instead of a keyboard where frequent critical numbers are entered.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
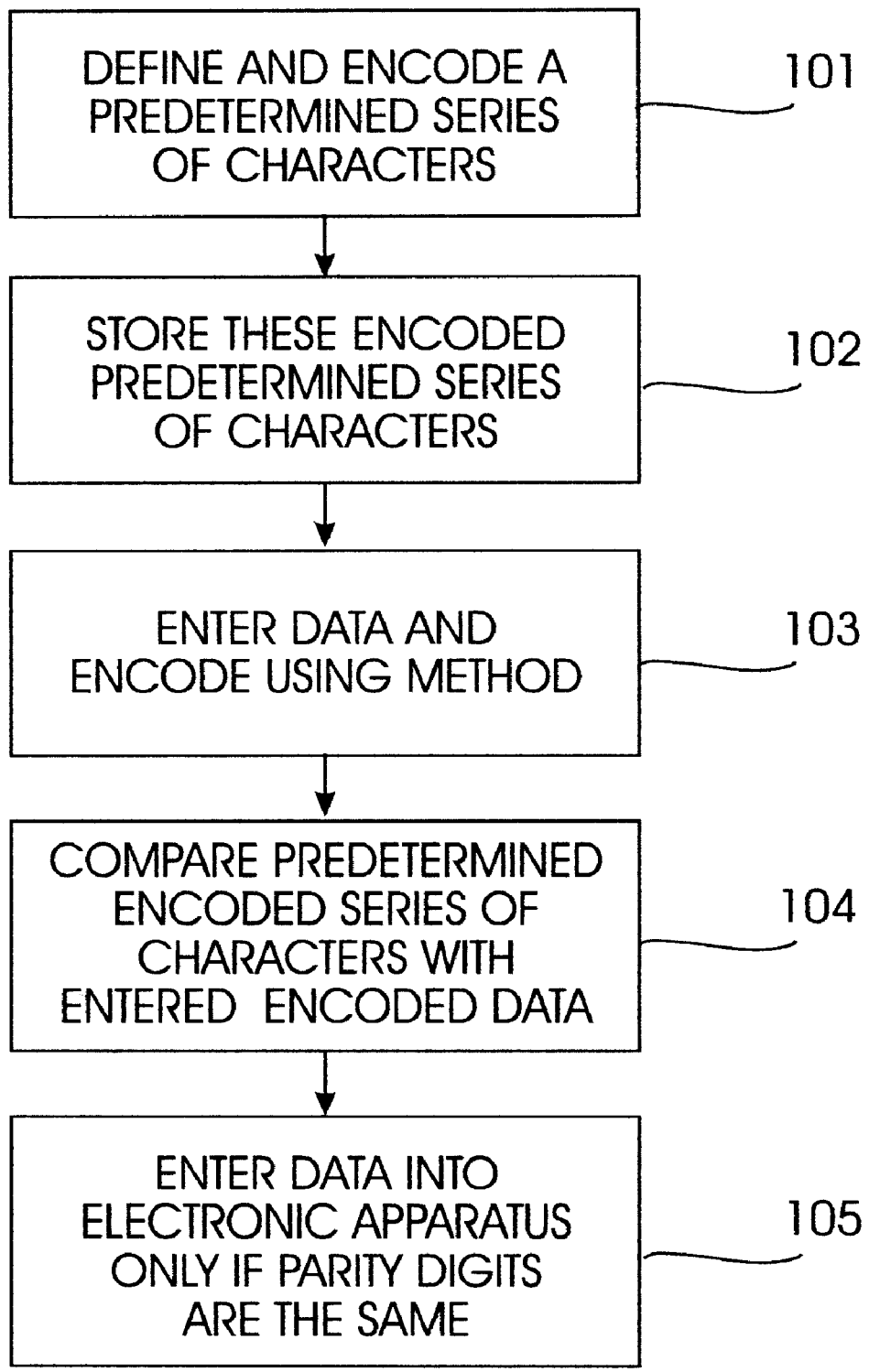
FIG. 1 shows a flow diagram illustrating the method of the invention.

A permutation of two adjacent characters (digits) designated as such on an input keyboard of an electronic apparatus (e.g., a personal computer) is a particular case of what in coding theory is known as a burst error of length 2. According to the Reiger bound, in order to detect all possible bursts of length 2, at least two redundant parity characters (digits) must be added to a series of characters (digits). Even in view of such restrictions, how to effectuate this using the set of decimal digits as configured on a computer keyboard is not obvious, since these characters do not constitute a field. Although codes (rules) over symbols constituting a field are well known (the cardinality of a finite field must be a power of a prime number, wherein the number 10 is not), there are not many codes having optimal properties over sets that are not fields. Using these principals, the invention herein includes mechanisms for detecting the most common typing errors using only one additional parity digit when considering fixed sets of digits (characters). Common typing errors that the method detects include permutation (transposition) of numerical characters (digits); and errors as to one of two possible adjacent numbers (characters) on a keyboard during data entry. Examples being a series of characters (digits), such as a social security or credit card number.

Encoding Algorithm using arithmetic modulo M: In one preferred embodiment, the invention provides an encoding algorithm for a series of n-characters (generally digits) that appends one or more parity characters from the entered data information in the form of a series of characters that excludes foraneous symbols in said parity characters. We describe the encoding for M=10, i.e., for digits from 0 to 9. The encoding of these series of characters of a fixed length n is as follows.

Considering a vector of digits $u=(u_0, u_1, \ldots, u_{n-1})$, the method of the invention adds to u a parity digit r. In effect, consider the 8-digit vector of weights $x=(2, 1, 4, 3, 6, 7, 8, 9)$. Notice that the only excluded digits are 0 and 5 (more about this later). Let w be the vector of weights $w=(w_0, w_1, \ldots, w_{n-1})$ defined as follows:

1. If n<8 then w is equal to the first n elements of x in reversed order.
2. If n=8 or n>8, then form a vector of length n by repeating the elements of x and then reverse the obtained vector. For example, if n=5, then w (6, 3, 4, 1, 2). If n=12, then w=(3, 4, 1, 2, 9, 8, 7, 6, 3, 4, 1, 2).

Then, given the vector of digits $u=(u_0, u_1, \ldots, u_{n-1})$ mentioned above, define the parity digit r as the inner product:

$$r = u \cdot w = u_0 \cdot w_0 + u_1 \cdot w_1 + \ldots + u_{n-1} \cdot w_{n-1} \pmod{10} \quad (1)$$

The notation mod 10 means that r equals the residue of dividing the sum above by 10. In the language of error-correcting codes, we are constructing an error-correcting code of dimension n and length n+1 over the ring of integers modulo 10, whose parity-check matrix is given by:

$$H = (w, 9), \quad (2)$$

where w is the vector of weights defined above. This is an encoding procedure for one digit. At the decoding or check procedure, if a typed number of length n+1, say, $(u_0, u_1, \ldots, u_{n-1}, u_n)$ is obtained, one finds first the parity digit r by applying the encoding procedure described above to $(u_0, u_1, \ldots, u_{n-1})$ and then compares r and $u_n$. If they coincide, then the vector is accepted, otherwise, an error is declared and noted by appropriate action (e.g., halting data entry, providing a visual or audible alarms to the operator).

Note that the vector of weights w alternates even and odd digits. Moreover, the difference between any two consecutive digits in the parity-check matrix H=(w, 9) is either 1, 3, 7 or 9. These 4 elements are invertible in the ring of integers modulo 10. The weights can certainly be ordered in any way we choose as long as the difference between consecutive digits in H is invertible. This property allows for detection of a permutation between adjacent digits (including the parity digit r). Also notice that the odd weights in H correspond to the digits 1, 3, 7 and 9 (5 has been excluded). As stated above, these four digits are invertible modulo 10. Thus, any error occurring in the locations corresponding to these digits will be detected. Errors in the locations corresponding to the even weights 2, 4, 5 and 8 will be detected most of the time, but not always, since all these numbers share the zero-divisor 5. That means, an error of magnitude 5 modulo 10 can be undetected. Specifically, this means that if a 0 is typed as a 5 (and conversely), it will be undetected. The same is true for 1 and 6, 2 and 7, 3 and 8 and 4 and 9. Notice that the digits in all these pairs are at maximum physical distance both in the keyboard and in the keypad, so the risk of typing one instead of the other is minimized. Also, we could have included the digit 5 in our vector of weights, but 5 has 4 zero-divisors, 2, 4, 6 and 8. Thus, errors of magnitude 2, 4, 6 or 8 modulo 10 would be undetected. For instance, if a 0 has been written and a 2, a 4, a 6 or an 8 are typed by mistake, then such an error would be undetected. Although such errors still do not involve adjacent keys in the keyboard, exclusion of the weight 5 is favored in a preferred embodiment of the invention.

Next the invention is illustrated for the case of n=5, thus, w=(6, 3, 4, 1, 2). Assume that the vector u=(5, 6, 7, 7, 0) is to be encoded. Thus, we have to perform the inner product u. w modulo 10, which gives u. w=5.6+6.3+7.4+7.1+0.2= 83=3 (modulo 10), since the residue of dividing 83 by 10 is 3. Thus, the encoded vector is (5, 6, 7, 7, 0, 3). Next, assume that we want to type this encoded vector. If we type it correctly, the number will be accepted. However, if we permute, say, the second and the third digit, that is, we type (5, 7, 6, 7, 0, 3), then we have to encode the first 5 digits first, which gives 5.6+7.3+6.4+7.1+0.2=82=2 (modulo 10). Since 2 g3, then an error is detected and the number is not accepted. The same occurs with any permutation of adjacent digits in the vector, all of these errors are detected.

Next, assume that the first digit of (5, 6, 7, 7, 0, 3) is typed in error and we type (4, 7, 6, 7, 0, 3) instead. Then, since 4.6+6.3+7.4+7.1+0.2=77=7 (modulo 10) and 7 g3, this error is detected. On the other hand, if the typed vector was (0, 6, 7, 7, 0, 3), then 0.6+6.3+7.4+7.1+0.2=53=3 (modulo 10), and this error is not detected. However, it is unlikely that 0 will be typed instead of 5, since the keys corresponding to these two digits are far away in the keyboard. Similarly, in the third digit, if a 2 is typed instead of a 7, then this error will be undetected, and in the fifth digit, if a 5 is typed instead of a 0 then the error will be undetected. Errors in the second, fourth or sixth location, on the other hand, are always detected.

The method was described for the ring of integers modulo 10, but can also be extended to any ring of integers. If alphanumeric characters are being used, numbers may be assigned to letters wherein for M-alphanumeric characters, by applying the concepts of the method of the invention to a ring of integers modulo M. When M is a prime number, a special case occurs wherein use of a prime number incorporates absence of zero-divisors that makes any single error in a digit detectable (as considered in U.S. Pat. No. 6,101, 245) but without need for foraneous symbols in the method.

Encoding Algorithm using arithmetic modulo a prime power q: In another preferred embodiment of the invention, the method of the invention can be used for detection of any symbol in error and any permutation of symbols whenever the number of symbols is a power of a prime number, not merely a prime number. This reduces the required number of foraneous symbols that need to be introduced in many cases, wherein detection of any single mistyped symbol can be so detected. To effectuate, let q be a prime power, and consider the finite field GF(q). Let a be a primitive element in GF(q), that is, the powers of a generate the non-zero elements in GF(q). Assume that we want to encode a vector of n symbols $u=(u_0, u_1, \ldots, u_{n-1})$. Consider a parity-check matrix consisting of the q−1 different powers of a written in a certain order. For instance, in a preferred embodiment, we may consider the following parity-check matrix of size 1×(n+1):

$$H=(\ldots 1\ a\ a^2\ a^3 \ldots a^{q-2}\ 1\ a\ a^2\ a^3 \ldots a^{q-2}\ -1) \quad (3)$$

In the equation above, the sequence $1\ a\ a^2\ a^3 \ldots a^{q-2}$ is repeated until completing the n entries and truncated as necessary. If q is even, the order above is convenient. If q is odd, some changes in the order of the powers of a may need to be made in order to maximize the detection capability against permutations. The code above can detect any symbol typed in error and any permutation between symbols that are up to q−1 symbols apart. In particular, it can detect any permutation between adjacent symbols.

As an example of the method, consider the hexadecimal numbers 0, 1, 2, . . . , 9, A, B, C, D, E, F, which can be represented by the elements of the finite field GF(16). Therefore, no foraneous symbols are necessary in this case. Then, any typing error involving permutation of adjacent hexadecimal numbers will be detected (and many other permutations) as well as any typing error involving a single hexadecimal number. If using the method in U.S. Pat. No. 6,101,245, a first prime number larger or equal than 16 must be established. Such a number is 17, so that '245 method requires the introduction of a foraneous symbol, which is not necessary by the invention herein with obvious advantages as stated above.

A second example of the advantages of using a prime power number as opposed to a prime number can be found in the example given in U.S. Pat. No. 6,101,245, column 11, lines 39 to 53: the method there is applied to cover numeric as well as case-sensitive letters. The total number of symbols is 62. The next prime number larger than 62 is 67. This requires the addition of 5 foraneous symbols. On the other hand, if a prime power approach is used like the one described in the present invention, the next prime power larger than 62 is 64. This requires the introduction of only 2 foraneous symbols. Alternatively, we can do arithmetic modulo 62 like we did modulo 10, and avoid foraneous symbols altogether. The price will be a slight reduction in the class of typing errors that can be detected, but the most common ones will still be detected.

Generalization to Multiple Parities: Another advantage of the prime power method as described above is that immediate generalization to multiple redundant symbols is provided. In effect, consider the systematic code given by the parity-check matrix whose two rows are given by:

$$\ldots 1\ a\ a^2\ a^3 \ldots a^{q-2}\ 1\ a\ a^2\ a^3 \ldots a^{q-2}\ -1\ 0$$

$$\ldots 1\ a^2\ a^4\ a^6 \ldots a^{2(q-2)}\ 1\ a^2\ a^4\ a^6 \ldots a^{2(q-2)}\ 0\ -1 \quad (4)$$

The first row coincides with the first row of the matrix H given by (3). However, a second row corresponding to a second parity symbol is now added. The second row, except for the last two entries, corresponds to the second powers of the first row. This is very similar to the construction of doubly-extended Reed-Solomon codes, except that repetition of columns is allowed once all the powers of the primitive element a have been exhausted. This new code with two parity symbols can detect any pair of consecutive errors. Moreover, it can detect any pair of errors provided that they are within up to q−2 symbols from each other. Further generalization involves taking a third row formed by the third powers of the first row, a fourth row formed by the fourth powers of the first row, etc.

We can also generalize the construction using arithmetic modulo M to multiple parities. In effect, for the purpose of illustration, consider M=10. By adding a second parity character to the construction on integers modulo 10, the second row must satisfy the following condition: the determinant of any two consecutive columns in the parity-check matrix has to be an invertible element modulo 10 (i.e., 1, 3, 7 or 9). This property allows for detection of any two consecutive errors, and for detection of most pairs of errors. As an example, consider the parity-check matrix given by:

$$\ldots 1\ 2\ 9\ 8\ 7\ 6\ 3\ 4\ 1\ 2\ 9\ 0$$

$$\ldots 1\ 3\ 2\ 1\ 1\ 1\ 2\ 3\ 1\ 3\ 0\ 9 \quad (5)$$

The determinant of the 2×2 matrix formed by two consecutive columns in the parity-check matrix above is invertible. The first row of the parity-check matrix is the same as the one of the parity-check matrix for one digit given by (2). The second row of the parity-check matrix given by (5) corresponds to the vector of weights ( . . . 1 3 2 1 1 1 2 3 1 3). For example, assume that one desires to encode a 10 digit-vector. The first vector of weights is (1 2 9 8 7 6 3 4 1 2) and the second one is (1 3 2 1 1 1 2 3 1 3). Moreover, assume that one desires to encode the 10 digit vector (0 3 0 7 1 9 9 4 5 3). Taking the inner product with the first vector of weights, one obtains: 0.1+3.2+0.9+7.8+1.7+9.6+9.3+4.4+ 5.1+3.2 177=7 (mod 10).

Taking the inner product with the second vector of weights, one obtains 0.1+3.3+0.2+7.1+1.1+9.1+9.2+4.3+ 5.1+3.3=70=0 (mod 10). Thus, the encoded vector is the 12-digit vector (1 2 9 8 7 6 3 4 1 2 7 0). Now every pair of consecutive errors can be detected. In particular, any typing error involving two consecutive digits can be detected. In effect, assume that when typing the 12-digit vector (1 2 9 8 7 6 3 4 1 2 7 0) obtained above, an error is made in the second digit and (1 7 9 8 7 6 3 4 1 2 7 0) is typed. By re-encoding the first 10 digits of this vector, i.e., (1 7 9 8 7 6 3 4 1 2), one obtains (1 7 9 8 7 6 3 4 1 2 7 5). The first parity digit is 7, which is the same that would be obtained from the scheme with one parity digit initially described. So, as discussed above, errors of size 5 (in this case, a 2 becomes a 7) go sometimes undetected when only one parity digit is used. However, in this case, the second parity digit is 5, which does not correspond to the 0 in the typed vector, and the error has been detected.

By generalizing the method of the invention to any number of parities, in the case of 2 parities, a parity-check matrix is selected such that each pair of consecutive columns has an invertible determinant modulo 10. One can add another row to the parity-check matrix (and thus, a third parity symbol) by requiring that any 3 consecutive columns have an invertible determinant. This process can be continued for any number of rows in the parity-check matrix, such that the resultant code detects a number of consecutive errors equal to the number of rows of the parity-check matrix. Although this generalization of the method of the invention has been illustrated for integers modulo 10, the above description is for illustration purposes only. One skilled in the art can readily extend this concept to any integer ring.

Figure 2:
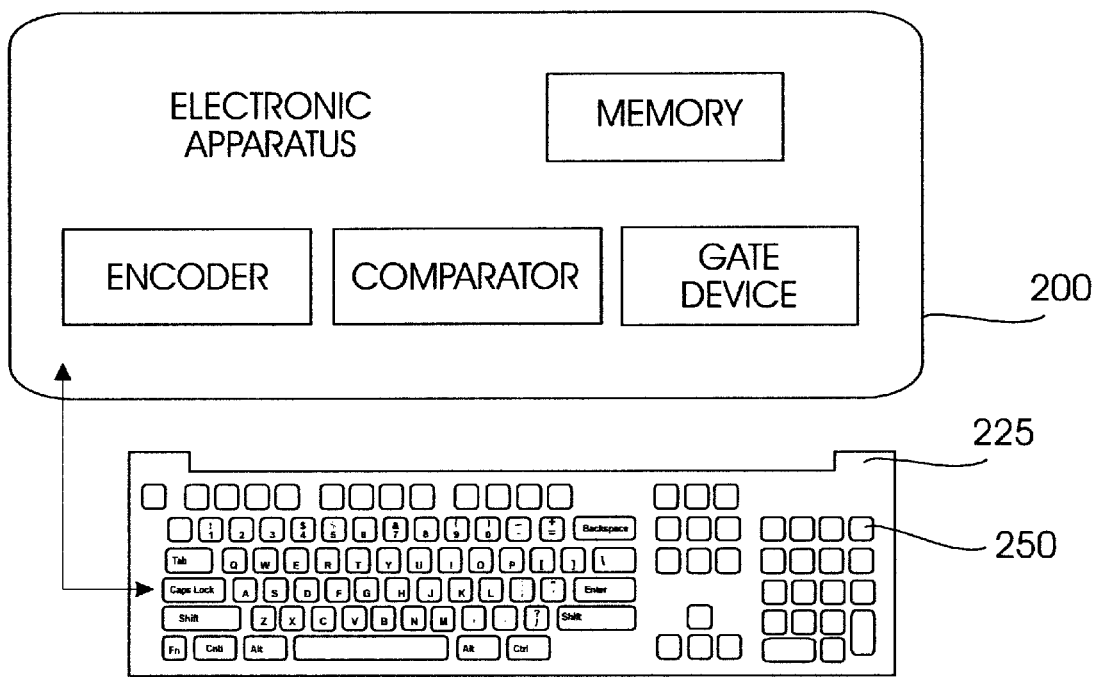
FIG. 2 shows a generalized form of the apparatus of the invention.

Referring now to FIG. 1 and FIG. 2, the method and electronic apparatus 200 of the invention are shown in general form. The method starts at step 101, a predetermined set of n-characters (digits) are encoded using the encoding method of the invention that are subsequently stored in memory at step 102. The apparatus in actual use at step 103 includes data entry by an operator using the data entry device (keyboard) 225 wherein n-characters (digits) significance are entered (e.g., a social security number) that may correlate with the predetermined encoded series of characters stored in the electronic apparatus 200. This entered n-character vector sequence is then encoded using the encoding algorithm wherein at least one secondary parity character(s) is re-computed. At steps 104, comparison of the stored parity character(s) with the secondary parity characters occurs. At step 105, if these parity character(s) coincide, then the n-character vector (data entry) is correct and data is processed. Otherwise an error is detected and data entry is suspended for appropriate correction.

Referring to FIG. 2, the invention in hardware form includes an input data entry device 225 such as a keyboard, keypad or other kind of data entry device (e.g., a keypunch machine for entering data on data cards for use with an electronic apparatus). Use of the invention is concerned with data entry, wherein typing into a keyboard often includes permutation (transposition) of numerical (character) digits. This form of error is readily detected as to one of two possible adjacent numbers (characters) on a keyboard during entry of a series of digits, e.g., a social security number or associated digits in a credit card number. Other examples where this occurs is e-commerce where many important short vectors (strings of characters) of crucial information are constantly typed. By using the invention theses errors are minimized as well.

Figure 3:
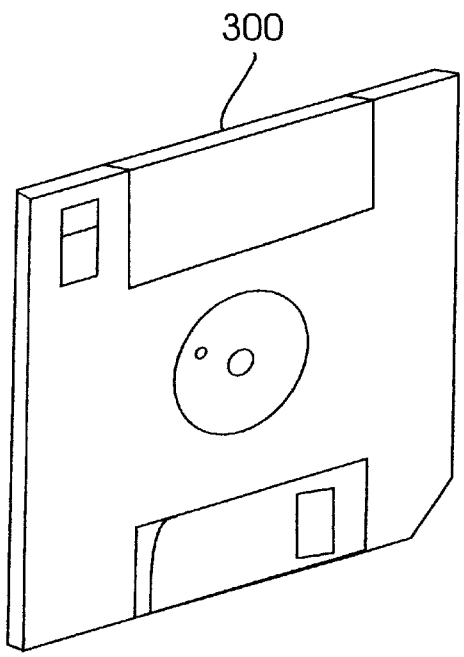
FIG. 3 shows a data storage disk for storing the method of the invention.

As mentioned above, actual encoded series of n-characters (digits) is determined prior to actual use by a data entry operator. These encoded series of numbers are stored in memory of the electronic apparatus 200. This stored encoded data can be applied universally by Governmental agencies or private business concerns. For example, social security numbers in many databases are used to associate a person with critical data (credit reports, criminal records, etc.), can be encoded. Hardware embodying the invention includes any electronic apparatus 200 having a data entry device 225 that in exemplary form may be a standard keyboard and/or a keypad data entry device 250. Voice recognition data entry devices can also be part of the apparatus. If keypunch/cards machines are used as part of the data entry device, the electronic apparatus still detects typing errors when such data cards are incorrectly typed and processed. Generic forms of the apparatus 200 may include, but are not limited to, a personal computer, a personal digital assistant having a touch-pad, or telecommunication equipment with various forms of data entry device(s). The memory in the electronic apparatus may comprise any hardware form for storing data, such as an integrated circuit memory, hard drive, optical disk drive, etc. The gate device can be hardware, firmware or software within the memory device coupled to a processor of the electronic apparatus, and be an application specific integrated circuit (ASIC) that cooperatively operates with a graphical unit interface display forming part of the apparatus. The encoder and comparator devices of the apparatus can be either software or firmware. The electronic apparatus 200 can be a unitary device or take the physical form of disparate parts incorporated in a larger local area network (LAN) where a data entry occurs at remote location(s). Moreover, using the foregoing specification, the method of the invention may be implemented via standard programming and/or engineering techniques. The resulting program(s) may be stored on disk, diskettes 300 as shown in FIG. 3, memory cards, ROM or any other memory device used in association with the electronic apparatus 200. For execution, the program(s) may be copied into the system memory (RAM) associated with the central processing unit of either a local or remote electronic apparatus that can be a single piece of hardware (e.g., a personal computer, personal digital assistant, etc.), connected in a local area network (LAN) or even form part of wide area network (WAN) wherein the Internet can be form part of the apparatus 200. Those skilled in the art of computer science will readily be able to combine the software created as described with appropriate general purpose or special purpose computer hardware to create an electronic apparatus embodying the invention. While the invention has been described in terms of preferred embodiments, those skilled in the art will recognize that the invention can be practiced with modification within the spirit and scope of the appended claims.

What is claimed is:

1. A method for verifying proper data entry into an electronic apparatus using a data entry device, the method comprising:

encoding and storing a predetermined series of n-characters from an alphabet of size M using a module M arithmetic encoding algorithm not requiring characters foraneous to said alphabet, whereby a resultant encoded series of characters adds at least one stored parity character(s) to said predetermined series of n-characters;

entering an entered series of typographical characters using said data entry device;

recomputing secondary parity character(s) from first n-characters of said entered series of characters using said encoding algorithm;

comparing said stored parity character(s) with corresponding said secondary parity character(s); and preventing data entry if said parity character(s) comparison of said secondary parity character(s) and said stored parity character(s) are different wherein said method is used for detecting a permutation of adjacent characters and mis-typed adjacent characters on said data entry device.

2. The method in claim 1, wherein said encoding algorithm comprises:

representing each of said series of n-characters from an alphabet of size M by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, u_{n-1})$ by appending to said u at least one parity-integer r, wherein r is determined by taking a residue modulo M of an inner product of vector u with a weight vector of integers modulo M $w=(w_0, w_1, \ldots, w_{n-1})$, wherein $i=0, 1, \ldots, n-1$.

3. The method in claim 2, wherein differences $w_i-w_{i+1}$ of consecutive weight integers $w_i$ and $w_{i+1}$ in said weight vector $w=(w_0, w_1, \ldots, w_{n-1})$ are invertible as integers modulo M and a sum $w_{n-1}+1$ of a last integer $w_{n-1}$ with an integer 1.

4. The method in claim 3, wherein said M is 10, and digits in said weight vector $w=(w_0, w_1, \ldots, w_{n-1})$ are selected so that digits $\ldots w_{n-5}, w_{n-3}, w_{n-1}$ belong in a set $\{2, 4, 6, 8\}$ and digits $\ldots w_{n-6}, w_{n-4}, w_{n-2}$ belong in a set $\{1, 3, 7, 9\}$.

5. The method in claim 1, wherein said encoding algorithm comprises:

representing each of said series of n characters in an alphabet of M characters by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, u_{n-1})$ by appending to said u a plurality of parity integers $r_0, r_1, \ldots, r_{L-1}$, wherein each said $r_j$ is determined by taking the residue modulo M of the inner product of vector u with a weight vector $w_{ji}=(w_{j,0}, w_{j,1}, \ldots, w_{j, n-1})$, wherein $j=0, 1, \ldots, L-1$.

6. The method in claim 5, wherein the vectors $w_{ji}$ are chosen so that in an L×(n+L) matrix formed by appending to an L×n matrix whose rows are said vectors $w_{ji}$ the L×L identity matrix, any L×L matrix obtained by taking L consecutive columns in said L×(n+L) matrix is invertible in a ring of integers modulo M.

7. The method in claim 1, wherein said encoding algorithm comprises:

choosing a first q such that said q is a prime power and $q \geq M$;

adding foraneous characters, if necessary, to said alphabet of M characters until a new set of q characters is obtained;

establishing a primitive element a in the finite field GF(q);

representing one of the q characters in said extended set of characters by 0 and the remaining characters by the q−1 powers $a^j$ of "a", wherein j runs from 0 to q−2;

establishing an n-character vector $u=(u_0, u_1, \ldots, u_{n-1})$, wherein each character $u_i$ is either 0 or a power of a dependent upon said representation; and encoding said n-character vector $u=(u_0, u_1, \ldots, u_{n-1})$ by appending to said u a plurality of parity characters $r_0$, $r_1, \ldots, r_{L-1}$, wherein each said $r_j$ is determined by taking an inner product of vector u with a weight vector $w_{ji}=(w_{j,0}, w_{j,1}, \ldots, w_{j, n-1})$, wherein said characters $w_{j,i}$ are powers of said primitive element "a" according to said representation.

8. The method in claim 7, wherein consecutive characters $w_{0,i}$ and $w_{0,i+1}$ in first of weight vectors $w_0=(w_{0,0}, w_{0,1}, \ldots, w_{0,n-1})$ are different and a last character $w_{0,n-1}$ is different from a character corresponding to −1 in GF(q).

9. The method in claim 7, wherein said weight vector $w_{ji}$ is chosen so that in an L×(n+L) matrix composed by appending to an L×n matrix whose rows are said weight vector $w_{ji}$ the L×L identity matrix, any L×L matrix obtained by taking L consecutive columns in said L×(n+L) matrix is invertible in the field GF(q).

10. The meted in claim 1, farther comprising providing a warning when said comparison of said parity character(s) are different.

11. The method in claim 10, wherein said warning can be deactivated.

12. The method in claim 10, wherein said warning suspends data entry.

13. The method in claim 1, wherein said entered series of characters comprise numerical digits.

14. The method in claim 1, wherein said entered series of characters comprise alphabetical letters, alphanumeric signs, and symbols; whereby said characters are entered through said data entry device.

15. The method in claim 1, wherein said method is used for detecting improper entry of a social security number.

16. An electronic apparatus for verifying proper data entry into said apparatus using a data entry device, said apparatus comprising:

a memory that stores a predetermined series of n-characters from an alphabet of size M using a module M arithmetic encoding algorithm not requiring characters foraneous to said alphabet, whereby each predetermined and encoded series of n-characters adds at least one stored parity character(s) thereto;

a data entry encoder that recomputes secondary parity character(s) using said encoding algorithm when typographical characters are entered through said data entry device;

a comparator that compares said stored and secondary parity character(s); and a gate device for disabling data entry if said parity character(s) are different.

17. The apparatus in claim 16, wherein said apparatus implements said encoding algorithm and generates said at least one parity character(s) by:

representing each of said series of n-characters from an alphabet of size M by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, u_{n-1})$ by appending to said u at least one parity-integer r, wherein r is determined by taking a residue modulo M of an inner product of vector as with a weight vector of integers modulo M, $w=(_0, w_1, \ldots, w_{n-1})$, wherein $i=0, 1, \ldots, n-1$.

18. The apparatus in claim 17, wherein differences $w_i-w_{i+1}$ of consecutive weight integers $w_i$ and $w_{i+j}$ in said weight vector $w=(w_0, w_1, \ldots, w_{n-1})$ are invertible as integers modulo M and a sum $w_{n-1}+1$ of a last integer $w_{n-1}$ with an integer 1.

19. The apparatus in claim 18, wherein said M is 10, and digits in said weight vector $w=(w_0, w_1, \ldots, {}_{n-1})$ are selected so that digits $\ldots w_{n-5}, w_{n-3}, w_{n-1}$ belong in a set $\{2, 4, 6, 8\}$ and digits $\ldots w_{n-6}, w_{n-4}, w_{n-2}$ belong in a set $\{1, 3, 7, 9\}$.

20. The apparatus in claim 16, wherein said encoding algorithm where multiple parity characters are generated comprises:

representing each of said series of n characters in an alphabet of M characters by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, u_{n-1})$ by appending to said u a plurality of parity integers $r_0, r_1, \ldots, r_{L-1}$, wherein each said $r_j$ is determined by taking the residue module M of the inner product of vector u with a weight vector $w_{ji}=(w_{j,0}, w_{j,1}, \ldots, w_{j,n-1})$, wherein $j=0, 1, \ldots, L-1$.

21. The apparatus in claim 20, wherein said weight vectors $w_{ji}$ are selected so that in an L×(n+L)-matrix formed by appending to an L×n-matrix whose rows are said vectors $w_{ji}$ L×L identity matrix, any L×L matrix obtained by taking L consecutive columns in said L×(n+L) matrix is invertible in a ring of integers modulo M.

22. The apparatus in claim 16, wherein said encoding algorithm comprises:

choosing a first q such that said q is a prime power and $q \geq M$;

adding foraneous characters, if necessary, to said alphabet of M characters until a new set of q characters is obtained;

establishing a primitive element "a" in the finite field GF(q);

representing one of the q characters in said extended set of characters by 0 and the remaining characters by the q−1 powers $a^j$ of a, wherein j runs from 0 to q−2;

establishing an n-character vector $u=(u_0, u_1, \ldots, u_{n-1})$, wherein each character $u_i$ is either 0 or a power of a dependent upon said representation; and encoding said n-character vector $u=(u_0, u_1, \ldots, u_{n-1})$ by appending to said u a plurality of panty characters $r_0, r_1, \ldots, r_{L-1}$, wherein each said $r_j$ is determined by taking an inner product of vector u with a weight vector $w_{ji}=(_{j,0}, w_{j,1}, \ldots, w_{j,n-1})$, wherein said characters $w_{j,i}$ are powers of said primitive element "a" according to said representation.

23. The apparatus in claim 22, wherein consecutive characters $w_{0,i}$ and $w_{0,i+1}$ in first of weight vectors $w_0=(w_{0,0}, w_{0,1}, \ldots, w_{0,n-1})$ are different and a last character $w_{0,n-1}$ is different from a character corresponding to −1 in GF(q).

24. The apparatus in claim 22, wherein said weight vector $w_{ji}$ is chosen so that in an L×(n+L) matrix composed by appending to an L×n matrix whose rows are said weight vector $w_{ji}$ the L×L identity matrix, any L×L matrix obtained by taking L consecutive columns in said L×(n+L) matrix is invertible in the field GF(q).

25. The apparatus in claim 16, wherein said gate device is a warning device that activates when said parity characters are different.

26. The apparatus in claim 16, wherein said gate device includes a bypass for deactivation.

27. The apparatus in claim 16, wherein said gate device includes an human perceivable output device that simultaneously activates when data entry is suspended.

28. A program storage device readable by a machine, tangibly embodying a program of instructions executable by said machine to perform a method for verifying proper data entry into said machine using a data entry device, said method comprising:

encoding and storing a predetermined series of n-characters from an alphabet of size M using a modulo M arithmetic encoding algorithm not requiring characters foraneous to said alphabet, whereby a resultant encoded series of characters adds at least one stored parity character(s) to said predetermined series of n-characters;

entering an entered series typographical characters using said data entry device;

recomputing secondary parity character(s) from first n-characters of said entered series of characters using said encoding algorithm;

comparing said stored parity character(s) with corresponding said secondary parity character(s); and preventing data entry if said parity character(s) comparison of said secondary parity character(s) and said stored parity character(s) are different wherein said method is used for detecting a permutation of adjacent characters and mis-typed adjacent characters on said data entry device.

29. The device in claim 28, wherein said encoding algorithm comprises:

representing each of said series of n-characters from an alphabet of size M by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, u_{n-1})$ by appending to said u at least one parity-integer r, wherein r is determined by taking a residue module M of an inner product of vector u with a weight vector of integers modulo M $w=(w_0, w_1, \ldots, w_{n-1})$, wherein $i=0, 1, \ldots, n-1$.

30. The device in claim 29, wherein differences $w_i w_{i+1}$ of consecutive weight integers $w_i$ and $w_{i+1}$ in said weight vector $w=(w_0, w_1, \ldots, w_{n-1})$ are invertible as integers module M and a sum $w_{n-1}+1$ of a last integer $w_{n-1}$ with an integer 1.

31. The device in claim 30, wherein said M is 10, and digits in said weight vector $w=(w_0, w_1, \ldots, {}_{n-1})$ are selected so that digits $\ldots w_{n-5}, w_{n-3}, w_{n-1}$ belong in a set $\{2, 4, 6, 8\}$ and digits $\ldots w_{n-6}, w_{n-4}, w_{n-2}$ belong in a set $\{1, 3, 7, 9\}$.

32. The device in claim 28, wherein said encoding algorithm for generating multiple parity characters comprises:

representing each of said series of n characters in an alphabet of M characters by an integer between 0 and M−1;

establishing an n-integer vector $u=(u_0, u_1, \ldots, u_{n-1})$, wherein each of said integers $u_i$ corresponds to a character in said alphabet of size M, and each $u_i$ is an integer between 0 and M−1; and encoding said n-integer vector $u=(u_0, u_1, \ldots, {}_{n-1})$ by appending to said u a plurality of parity integers $r_0, r_1, \ldots, r_{L-1}$, wherein each said $r_j$ is determined by taking the residue module M of the inner product of vector u with a weight vector $w_{ji}=(w_{j,0}, w_{j,1}, \ldots, w_{j,n-1})$, wherein $i=0, 1, \ldots, L-1$.

33. The device in claim 32, wherein said weight vector $w_{ji}$ are selected so that in an L×(n+L) matrix formed by appending to an L×n-matrix whose rows are said vectors $w_{ji}$, the L×L identity matrix, any L×L matrix obtained by taking L consecutive columns in said L×(n+L) matrix is invertible in the ring of integers module M.

34. The device in claim 28, wherein said encoding algorithm comprises:

choosing a first q such that said q is a prime power and $q \geq M$;

adding foraneous characters, if necessary, to said alphabet of M characters until a new set of q characters is obtained;

establishing a primitive element a in the finite field GF(q);

representing one of the q characters in said extended set of characters by 0 and the remaining characters by the q−1 powers $a^j$ of "a", wherein j runs from 0 to q−2;

establishing an n-character vector $u=(u_0, u_1, \ldots, u_{n-1})$, wherein each character $u_i$ is either 0 or a power of a dependent upon said representation; and encoding said n-character vector $u=(u_0, u_1, \ldots, u_{n-1})$ by appending to said u a plurality of parity characters $r_0, r_1, \ldots, r_{L-1}$, wherein each said $r_j$ is determined by taking an inner product of vector u with a weight vector $w_{ji}=(w_{j,0}, w_{j,1}, \ldots, w_{j,n-1})$, wherein said characters $w_{j,i}$ are powers of said primitive element "a" according to said representation.

35. The device in claim 34, wherein consecutive characters $w_{0,i}$ and $w_{0,i+1}$ in first of weight vectors $w_0=(w_{0,0}, w_{0,1}, \ldots, w_{0,n-1})$ are different and a last character $w_{0,n-1}$ is different from a character corresponding to −1 in GF(q).

36. The device in claim 34, wherein said weight vector $w_{ji}$ is chosen so that in an L×(n+L) matrix composed by appending to an L×n matrix whose rows are said weight vector $w_{ji}$ the L×L identity matrix, any L×L matrix obtained by taking L consecutive columns in said L×(n+L) matrix is invertible in the field GF(q).

37. The device in claim 28, further comprising a step of providing an output warning when said parity character(s) are different.

38. The device in claim 37, wherein said warning includes a bypass mode for deactivating said warning.

39. The device in claim 37, wherein said warning includes suspending data entry.

40. The device in claim 28, wherein said series of characters comprise numerical digits.

41. The device in claim 28, wherein said series of characters comprise alphabetical letters.

* * * * *